US012598888B2

(12) United States Patent
Ramos Carneiro

(10) Patent No.: US 12,598,888 B2
(45) Date of Patent: Apr. 7, 2026

(54) TUNEABLE SUB-PIXEL

(71) Applicant: PLESSEY SEMICONDUCTORS LIMITED, Plymouth (GB)

(72) Inventor: Steven Ramos Carneiro, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 665 days.

(21) Appl. No.: 17/921,551

(22) PCT Filed: Apr. 27, 2021

(86) PCT No.: PCT/EP2021/060930
  § 371 (c)(1),
  (2) Date: Oct. 26, 2022

(87) PCT Pub. No.: WO2021/219603
  PCT Pub. Date: Nov. 4, 2021

(65) Prior Publication Data
  US 2023/0163109 A1    May 25, 2023

(30) Foreign Application Priority Data
  Apr. 28, 2020    (GB) ...................................... 2006249

(51) Int. Cl.
  *H01L 29/20* (2006.01)
  *H01L 25/075* (2006.01)
  (Continued)

(52) U.S. Cl.
  CPC ......... *H10K 59/38* (2023.02); *H01L 25/0753* (2013.01); *H10N 39/00* (2023.02)

(58) Field of Classification Search
  CPC .. H10K 59/38; H10K 59/50; H10K 2102/331; H10N 39/00; H10H 20/851; H10H 29/142; H01L 25/0753
  See application file for complete search history.

(56) References Cited

U.S. PATENT DOCUMENTS

2005/0227063 A1    10/2005    Lawandy
2016/0064683 A1    3/2016    Toyoda et al.
(Continued)

FOREIGN PATENT DOCUMENTS

JP    2007123731 A    5/2007
WO    2017108962 A1    6/2017

OTHER PUBLICATIONS

International Search Report and Written Opinion, PCT/EP2021/060930, dated Aug. 2, 2021, 14 pages.
(Continued)

*Primary Examiner* — Ismail A Muse
(74) *Attorney, Agent, or Firm* — Stinson LLP

(57) ABSTRACT

A light-emitting device having a pixel comprising a first non-tuneable sub-pixel configured to emit light at a first non-tuneable wavelength and a tuneable sub-pixel configured to emit light at a tuneable wavelength. The tuneable sub-pixel comprises a primary light-emitting material configured to emit light at a primary wavelength in response to a primary electrical input; and a tuning element configured to modify the primary wavelength to a secondary wavelength, wherein the secondary wavelength is tuneable, in response to a secondary electrical input.

12 Claims, 18 Drawing Sheets

(51) Int. Cl.
    *H01L 33/00*          (2010.01)
    *H10K 59/38*          (2023.01)
    *H10N 39/00*          (2023.01)

(56) References Cited

U.S. PATENT DOCUMENTS

| | | | |
|---|---|---|---|
| 2016/0225947 A1 | 8/2016 | Murayama et al. | |
| 2017/0069852 A1* | 3/2017 | Kanamoto | C09K 11/06 |
| 2017/0309795 A1* | 10/2017 | Kim | H10H 20/854 |
| 2018/0072942 A1 | 3/2018 | Yamada et al. | |
| 2019/0018287 A1* | 1/2019 | Lüchinger | C09K 11/665 |
| 2019/0371231 A1 | 12/2019 | Kim et al. | |
| 2020/0018877 A1* | 1/2020 | Zhou | G02B 5/223 |
| 2021/0184074 A1 | 6/2021 | Miyanaga et al. | |
| 2023/0057673 A1* | 2/2023 | Asaoka | H10H 20/8514 |
| 2024/0304765 A1* | 9/2024 | Shigitani | H10H 20/8513 |
| 2025/0051637 A1* | 2/2025 | Kido | C08L 101/00 |

OTHER PUBLICATIONS

Great Britain Search Report, Application No. GB2006249.3, dated Sep. 11, 2020, 6 pages.
Taiwanese Search Report, Application No. 110115059, dated Mar. 20, 2022, 7 pages.

* cited by examiner

110

140

130

120

100

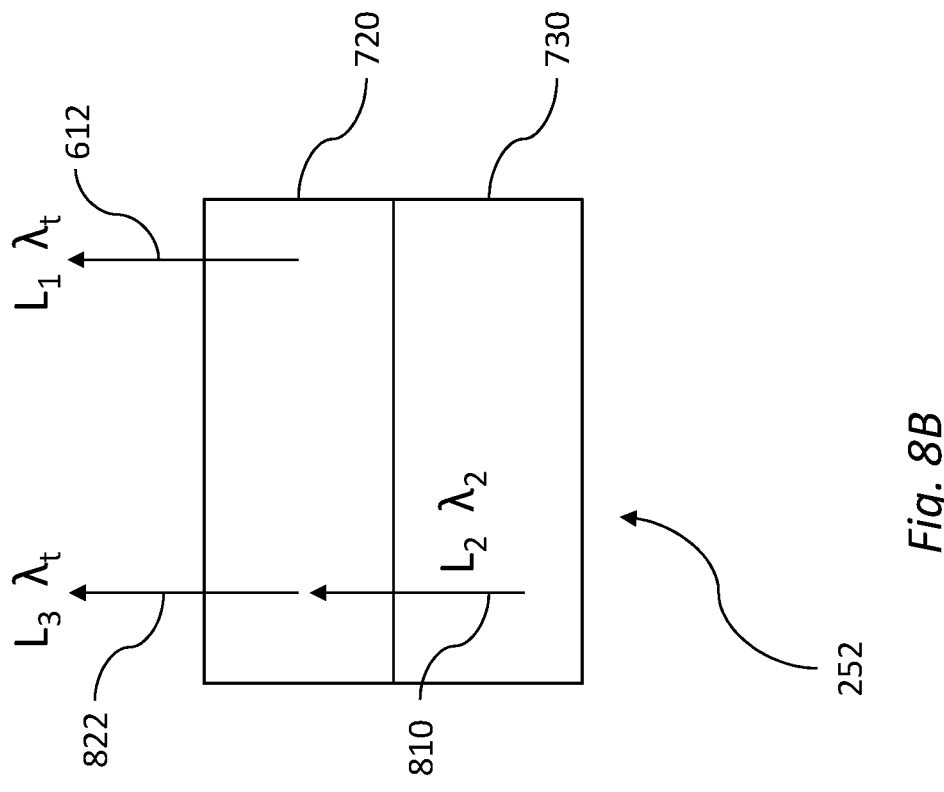
Fig. 8B
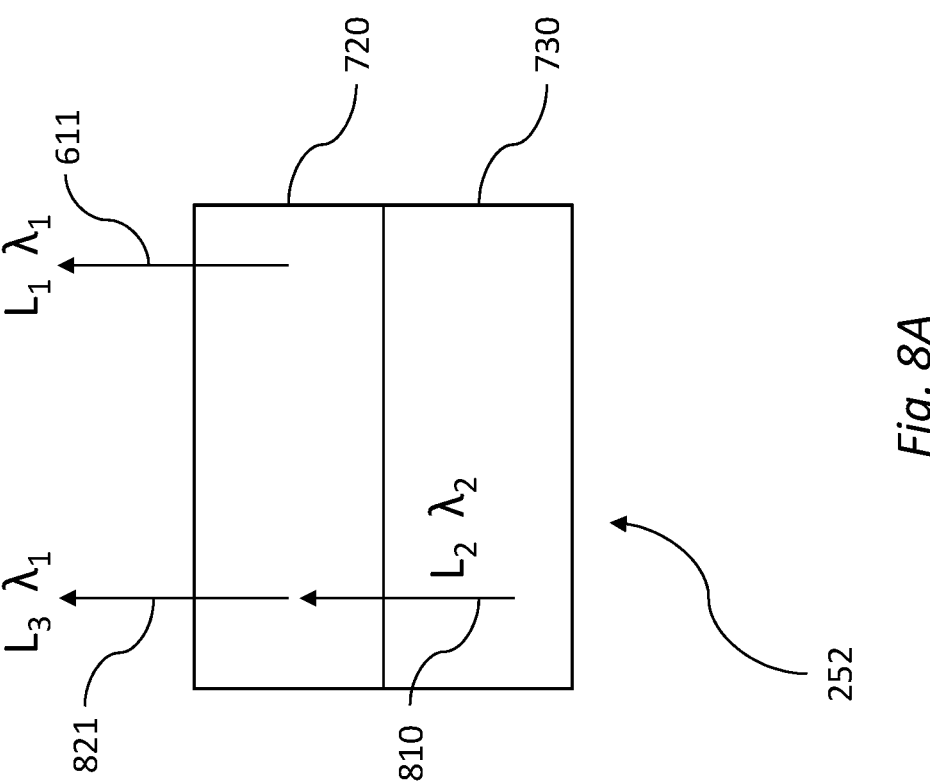
Fig. 8A
Fig. 8

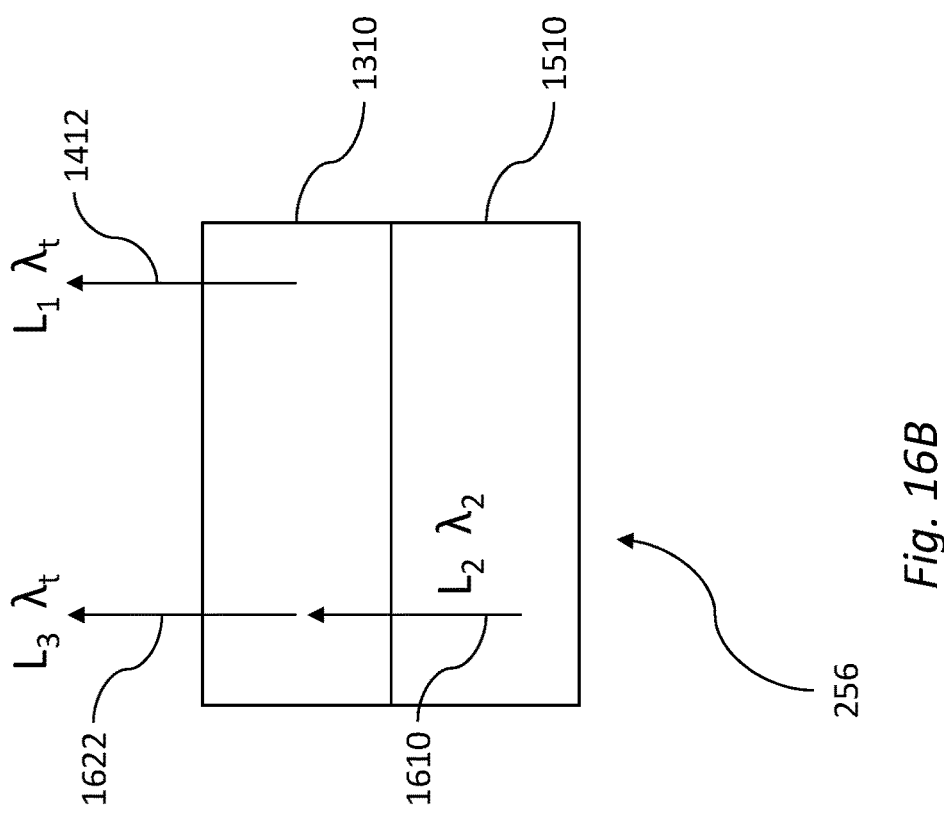
*Fig. 16B*
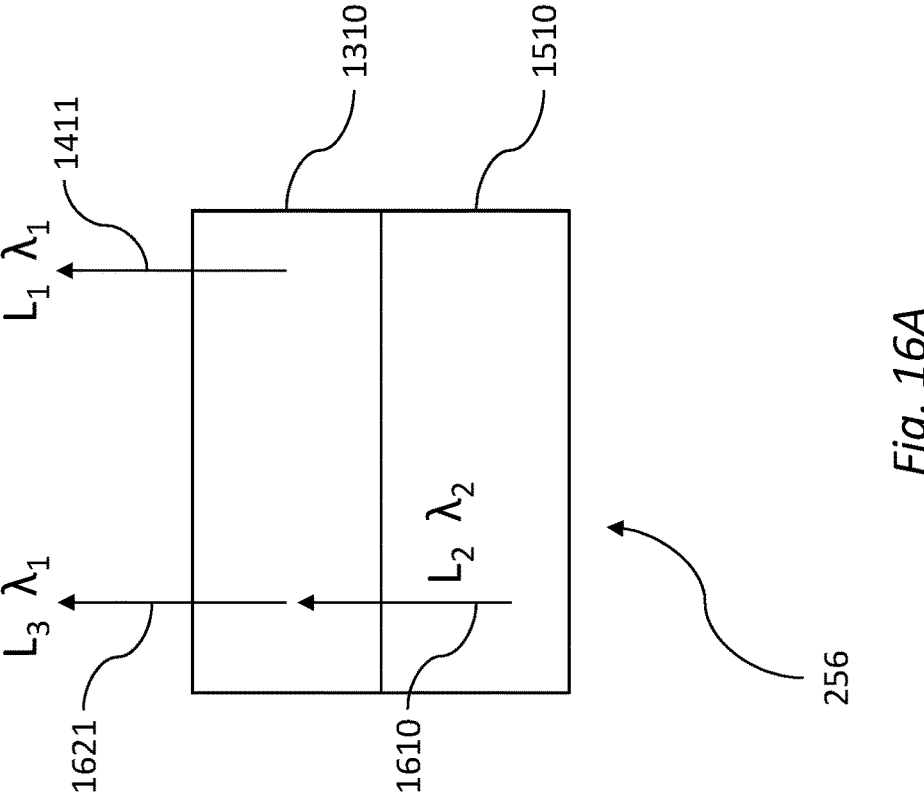
*Fig. 16A*
*Fig. 16*

TUNEABLE SUB-PIXEL

REFERENCE TO RELATED APPLICATIONS

This application is a 371 U.S. national stage application of International Patent Application No. PCT/EP2021/060930, filed Apr. 27, 2021, which claims the benefit of United Kingdom Patent Application No. 2006249.3, filed Apr. 28, 2020, the entire disclosures of which are incorporated herein by reference.

FIELD OF THE DISCLOSURE

The disclosure relates to the field of display technologies comprising configurations of sub-pixels.

BACKGROUND

In most existing display technologies, images are rendered by the amalgamation of pixels. The pixels generally have fixed properties, for example colour and spatial configuration. Pixels may be spatially configured in groups, for example in a stripe pattern, wherein the groups may comprise pixels of different colours which may be combined to render images in any colour. For example, a common configuration is a triplet of sub-pixels comprising a red sub-pixel, a green sub-pixel and a blue sub-pixel. Any colour within the gamut of the sub-pixels can be rendered by using a combination of the three sub-pixels, or white light can be achieved using the sum of the three pixels. Another example configuration would be a group of four sub-pixels comprising a red sub-pixel, a green sub-pixel, a blue sub-pixel and a white sub-pixel.

Sub-pixels are generally fixed colours, but may degrade over time and lose luminance or change colour. It may also be the case that a display may be used for applications which require different resolutions or luminance. It is an object of the present invention to provide a tuneable sub-pixel that can be used to correct for local defects, to increase resolution or to increase luminance. A tuneable sub-pixel may also be used to modify the colour gamut of the display.

Quantum dots are known to emit light. In the event that an electron is excited from the valence band to the conduction band, a hole is left in the valence band. The resulting electron hole pair is known as an exciton, and the recombination of the electron and hole pair may result in the emission of a photon. The energy of the emitted photon may be the sum of the band gap energy, the confinement energy of the hole and the excited electron and the binding energy of the exciton. The electron may be excited in the event that a photon with an energy equal to the band gap is absorbed, or via electrical excitation.

SUMMARY OF THE DISCLOSURE

Against this background there is provided: a light-emitting device having a pixel comprising:
    a first non-tuneable sub-pixel configured to emit light at a first non-tuneable wavelength; and
    a tuneable sub-pixel configured to emit light at a tuneable wavelength, wherein the tuneable sub-pixel comprises:
    a primary light-emitting material configured to emit light at a primary wavelength in response to a primary electrical input; and
    a tuning element configured to modify the primary wavelength to a secondary wavelength, wherein the secondary wavelength is tuneable, in response to a secondary electrical input.

In this way, the colour of the light emitted by tuneable sub-pixel may be modified, and the properties of the pixel modified. For example the resolution, luminance or colour gamut of the pixel may be modified or local defects may be corrected for.

The primary light-emitting material may comprise quantum dots.

Advantageously, quantum dots may emit light via electrical pumping or by optically assisted electrical pumping.

The tuning element may comprise a piezoelectric actuator that applies stress to the light-emitting material to strain the quantum dots.

In this way, the secondary wavelength may be modified in real time such that the colour of the tuneable sub-pixel may be tuned while in use.

The secondary wavelength may be a function of strain, and a target wavelength for the secondary wavelength may correspond to an applied stress value.

In this way, the modification of the secondary wavelength may be controlled such that the secondary wavelength is tuned to a particular value.

The light-emitting device may further comprise a controller configured to determine whether the secondary wavelength is equal to the target wavelength corresponding to the applied stress value, and in the event that the secondary wavelength is not equal to the target wavelength to modify the stress applied to the semiconductor material until the secondary wavelength is equal to the target wavelength.

Advantageously, the secondary wavelength may be adjusted in the event that it is not at the expected value.

The tuneable sub-pixel may further comprise a light emitter that emits light at a light emitter wavelength.

The quantum dots may be further configured to modify the light emitted at the light emitter wavelength such that the light emitted by the quantum dots is at the primary wavelength.

In this way, the quantum dots may undergo optical pumping and electrical pumping simultaneously, which may increase the optical gain and therefore the colour conversion efficiency.

The secondary wavelength may be a function of strain, and a target wavelength for the secondary wavelength may correspond to an applied stress value.

In this way, the modification of the secondary wavelength may be controlled such that the secondary wavelength is tuned to a particular value.

The tuneable sub-pixel may further comprise a secondary light-emitting material comprising quantum dots, wherein the secondary light-emitting material may be configured to convert light at the primary wavelength to light at a tertiary wavelength and to emit light at the tertiary wavelength in response to a tertiary electrical input.

In this way the wavelength of the light emitted by the primary light-emitting material may be modified.

The tuneable sub-pixel may further comprise a tertiary light-emitting material comprising quantum dots, wherein the tertiary light-emitting material may be configured to convert light at the tertiary wavelength to light at a quaternary wavelength and to emit light at the quaternary wavelength in response to a quaternary electrical input.

In this way the wavelength of the light emitted by the primary and secondary light-emitting materials may be modified.

The primary, secondary and tertiary light-emitting materials may emit light in an event that an applied electric current is above a threshold and transmit light in an event that an applied electric current is below a threshold.

In this way the wavelength of the light emitted by the tuneable sub-pixel may be tuned by controlling which of the primary, secondary and tertiary light-emitting materials emit light and convert light. Zero, one, two or three of the primary, secondary and tertiary light-emitting materials may emit light at one time. The secondary wavelength may be modified in real time such that the colour of the tuneable sub-pixel may be tuned while in use.

The secondary electrical input may be a combination of one or more of the primary, tertiary and quaternary electrical inputs.

Advantageously, each of the primary, secondary and tertiary light-emitting materials may be individually controlled by the primary, tertiary and quaternary electrical inputs such that the secondary wavelength of the light emitted by the tuneable sub-pixel may be tuned electrically.

The secondary wavelength may be a function of the primary, tertiary and quaternary wavelengths.

Advantageously, the secondary wavelength may be tuned accurately by controlling the emission of the primary, secondary and tertiary light-emitting materials.

The tuneable sub-pixel may further comprise a light emitter that emits light at a light emitter wavelength and wherein the primary light-emitting material may be further configured to modify the light emitted at the light emitter wavelength such that the light emitted by the primary light-emitting material is at the primary wavelength.

In this way, the quantum dots may undergo optical pumping and electrical pumping simultaneously, which may increase the optical gain and therefore the colour conversion efficiency.

The primary light emitting material may comprise a light emitting molecule configured to emit light at wavelengths tuneable between the primary wavelength and the secondary wavelength by applying an electric field via the secondary electrical input so as to influence molecular topology of the light emitting molecule.

In this way, the secondary wavelength of the light emitted by the tuneable sub-pixel may be accurately tuned electrically in real time such that the colour of the tuneable sub-pixel may be tuned while in use.

The light-emitting device may further comprise a secondary light-emitting material comprising a light-emitting molecule that may be configured to convert light at the primary wavelength to light at a tertiary wavelength and to emit light at the tertiary wavelength in response to a tertiary electrical input.

In this way the wavelength of the light emitted by the primary light-emitting material may be modified.

The light-emitting device may further comprise a tertiary light-emitting material comprising a light-emitting molecule that may be configured to convert light at the tertiary wavelength to light at a quaternary wavelength and to emit light at the quaternary wavelength in response to a quaternary electrical input.

In this way the wavelength of the light emitted by the primary and secondary light-emitting materials may be modified.

The primary, secondary and tertiary light-emitting materials may emit light in an event that an applied electric current is within a range and transmit light in an event that an applied electric current is outside the range.

In this way the wavelength of the light emitted by the tuneable sub-pixel may be tuned by controlling which of the primary, secondary and tertiary light-emitting materials emit light and convert light. Zero, one, two or three of the primary, secondary and tertiary light-emitting materials may emit light at one time. The secondary wavelength may be modified in real time such that the colour of the tuneable sub-pixel may be tuned while in use.

The tuneable sub-pixel may further comprise a light emitter that emits light at a light emitter wavelength and wherein the primary light-emitting material may be further configured to modify the light emitted at the light emitter wavelength such that the light emitted by the primary light-emitting material is at the primary wavelength.

In this way, the quantum dots may undergo optical pumping and electrical pumping simultaneously, which may increase the optical gain and therefore the colour conversion efficiency.

One or more of the primary, secondary or tertiary light-emitting material may be dissolved in a host material.

In this way, the primary, secondary or tertiary light-emitting materials may be deposited as a thin film and patterned.

One or more of the primary, secondary and tertiary light-emitting material may be nanopatterned.

Advantageously, the primary, secondary and tertiary light-emitting materials may be nanopatterned such that they are transparent in the event that they are not emitting light.

The pixel may have a second non-tuneable sub-pixel configured to emit light at a second non-tuneable wavelength and a third non-tuneable sub-pixel configured to emit light at a third non-tuneable wavelength.

In this way, the pixel may emit light within the colour gamut of the three non-tuneable sub-pixels. The tuneable sub-pixel may be used to alter the colour gamut, or to modify luminance or resolution, or to compensate for local defects, or for other purposes.

The first, second and third non-tuneable sub-pixels may each emit one of red, green and blue light.

Advantageously, the tuneable sub-pixel may be integrated into displays with a common colour gamut.

The light-emitting device may further comprise a controller configured to modify the secondary electrical input.

Advantageously, the secondary wavelength may be tuned electrically while in use.

The controller may be further configured to modify the secondary electrical input in response to an input.

Advantageously, the secondary wavelength may be tuned electrically while in use in response to user instructions or to data from the display.

BRIEF DESCRIPTION OF THE DRAWINGS

A specific embodiment of the disclosure will now be described, by way of example only, with reference to the accompanying drawings in which:

FIG. 8 shows a schematic indicating the light emitted by a quantum dot material on a light emitter without strain (FIG. 8A) and under strain (FIG. 8B).

FIG. 16 shows a schematic indicating light emitted and converted by a light-emitting material on a light-emitter without a change in molecular topology (FIG. 16A) and with a change in molecular topology (FIG. 16B).

DETAILED DESCRIPTION

Figure 1:
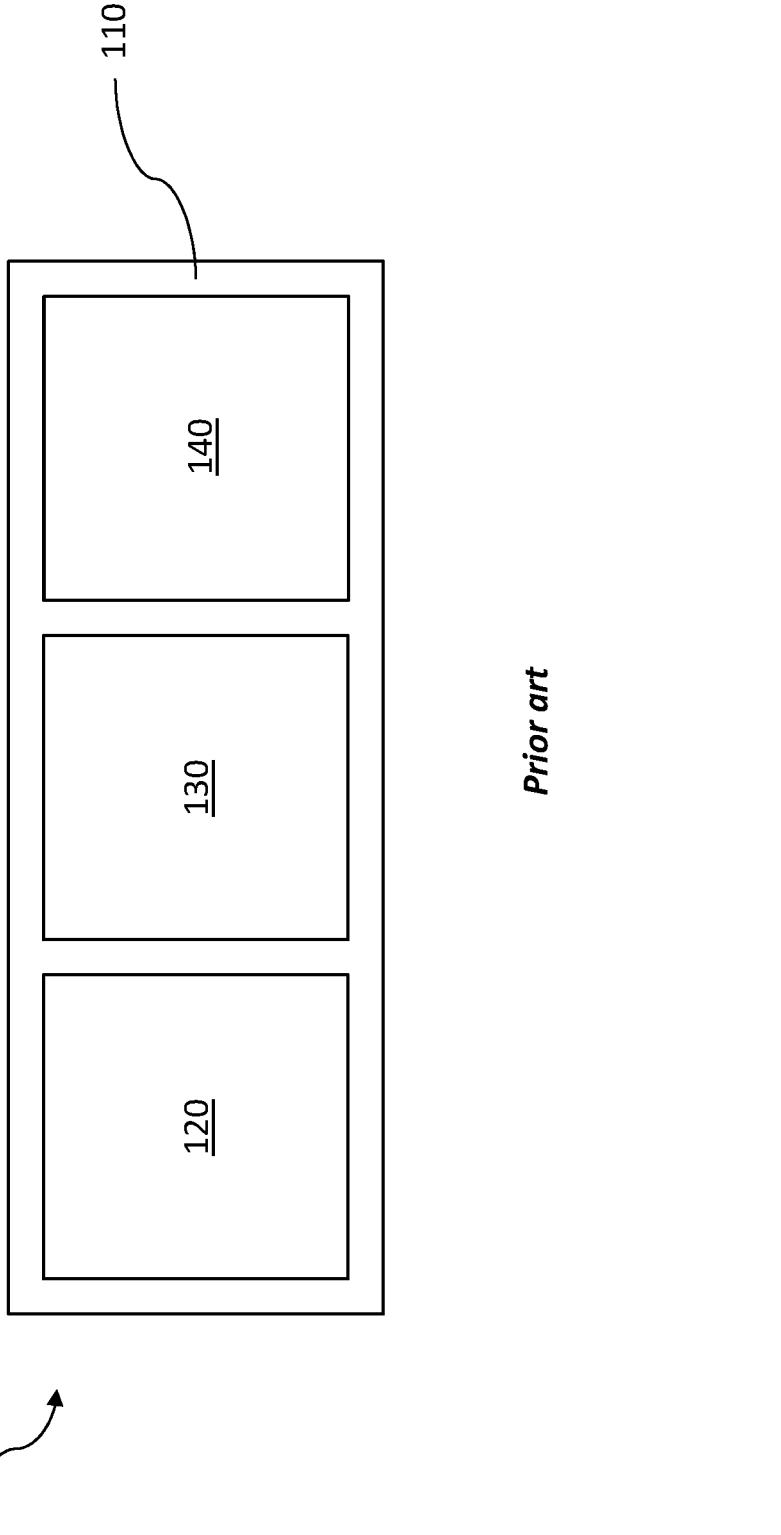
FIG. 1 shows a simple schematic plan view of a non-tuneable sub-pixel configuration known in prior art.

A common sub-pixel configuration for a pixel 100 is indicated in FIG. 1. The pixel 100 comprises first, second and third sub-pixels 120, 130 and 140, wherein the first sub-pixel 120 may be red (R), the second sub-pixel 130 may be green (G) and the third sub-pixel 140 may be blue (B). This configuration may be known as an RGB triplet. The sub-pixels emit light in response to an electric current. The sub-pixel configuration 100 may further comprise a substrate 110 that may comprise one or more electrodes. Each sub-pixel has an emission spectrum centred at a pre-determined wavelength, so once fabricated the colour of the light emitted by each sub-pixel cannot be tuned (though it may degrade with time and/or it may exhibit subtle colour changes at different luminances). A combination of the first, second and third sub-pixels 120, 130 and 140 may be used to render light of another colour. A sum of the first, second and third sub-pixels 120, 130 and 140 may be used to produce white light. The first, second and third sub-pixels 120, 130 and 140 may comprise monochromatic micro-LEDs.

Figure 2:
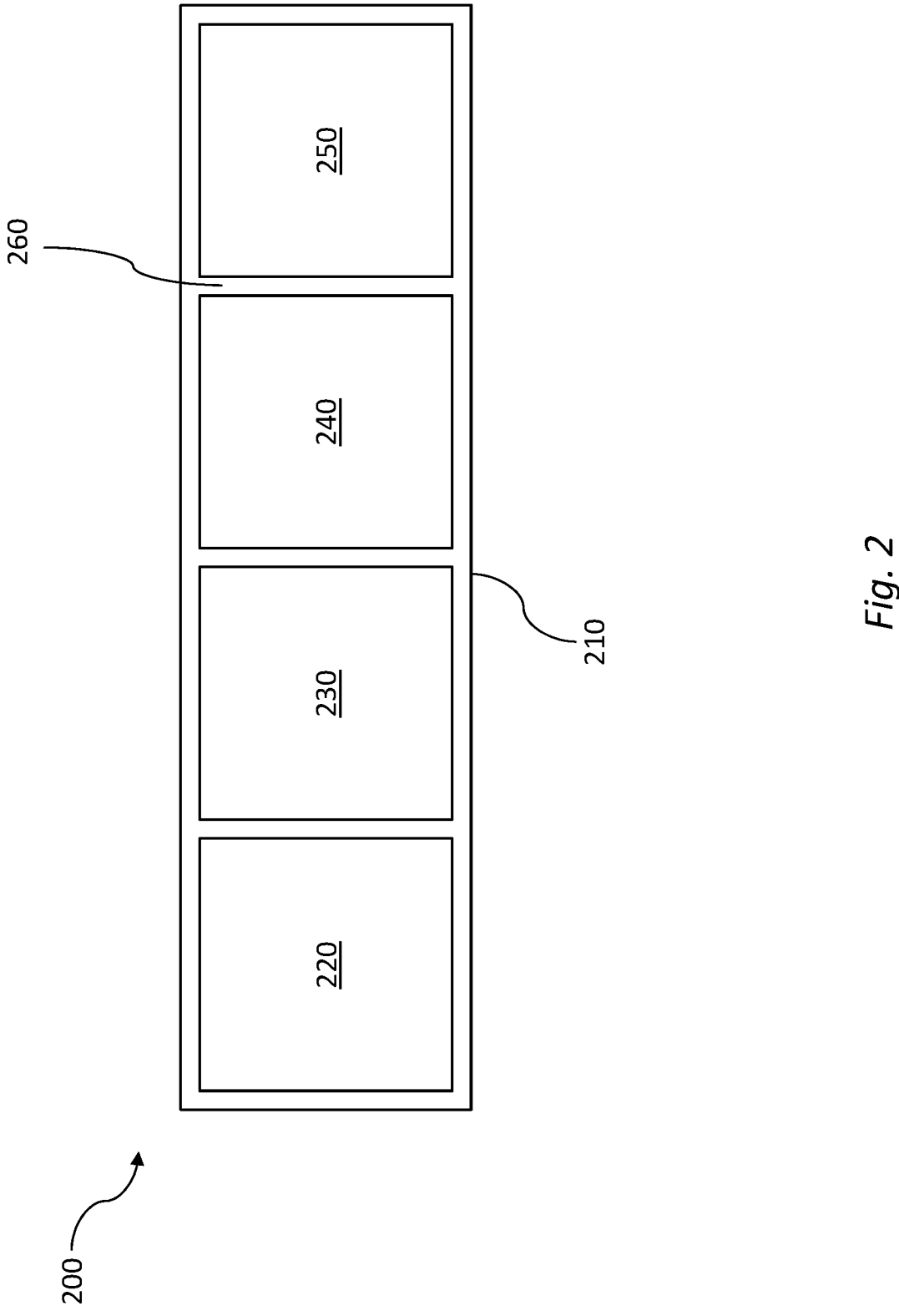
FIG. 2 shows a simple schematic plan view of a sub-pixel configuration comprising three non-tuneable sub-pixels and one tuneable sub-pixel.
Figure 3:
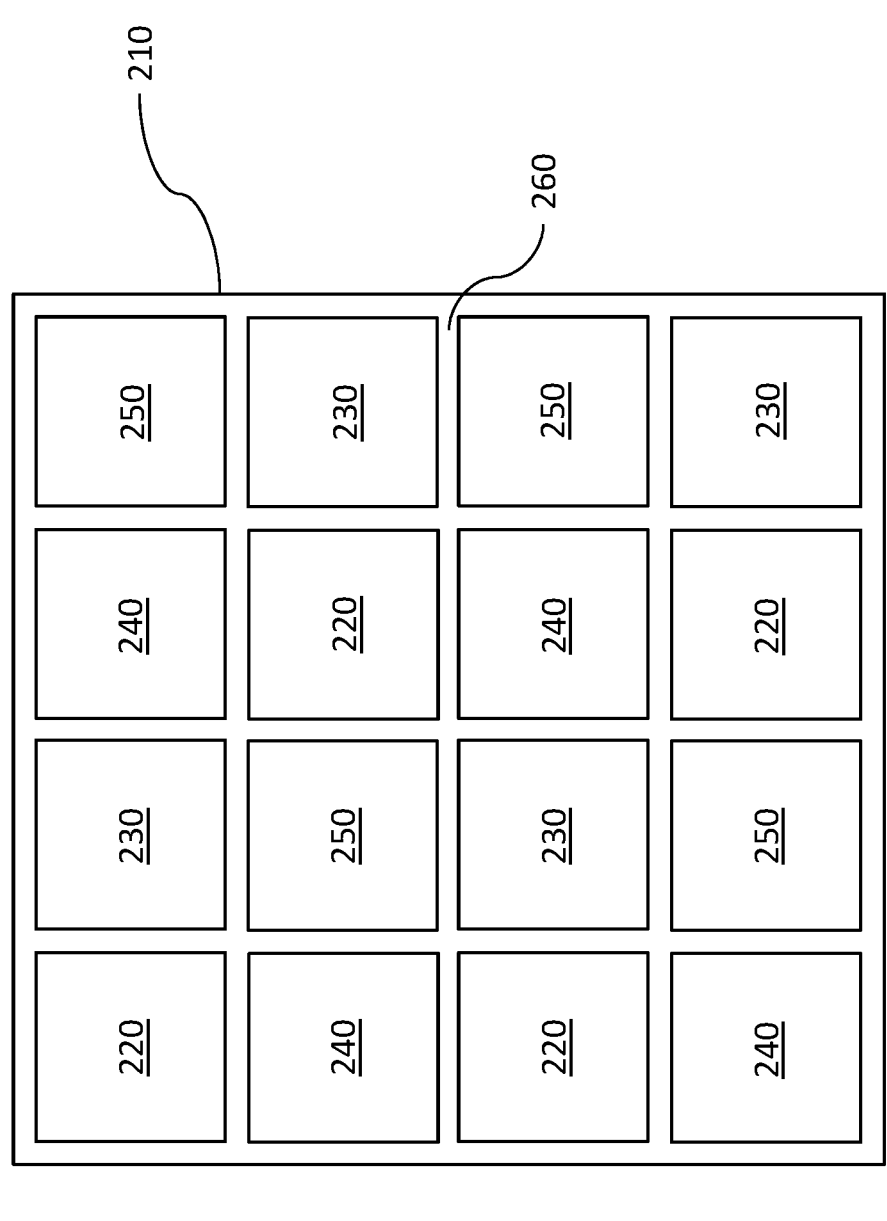
FIG. 3 shows a simple schematic plan view of a pixel configuration comprising a plurality of non-tuneable sub-pixels and a plurality of tuneable sub-pixels.
Figure 3:
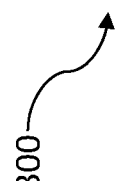

With reference to FIG. 2, a sub-pixel configuration for a pixel 200 is shown that is in accordance with an embodiment of the disclosure. The pixel 200 may comprise at least one non-tuneable sub-pixel that is configured to have an emission spectrum centred at a pre-determined wavelength, and at least one tuneable sub-pixel that is configured to have an emission spectrum that can be shifted in real time. The pixel 200 may comprise first, second and third non-tuneable sub-pixels 220, 230 and 240 and a tuneable sub-pixel 250 on a substrate 210. First, second and third non-tuneable sub-pixels 220, 230 and 240 and the tuneable sub-pixel 250 are separated by a light blocking material 260 that prevents light cross talk between sub-pixels The first, second and third non-tuneable sub-pixels 220, 230 and 240 may be red, green and blue. The first, second and third non-tuneable sub-pixels 220, 230 and 240 are configured to emit light in response to an electric current. The tuneable sub-pixel 250 may be configured to emit first light centred at a first wavelength, also referred to as a primary wavelength, in response to a first electrical input, also referred to as a primary electrical input, wherein the first electrical input may comprise an electric current. The tuneable sub-pixel 250 may further comprise a tuning element that is configured to modify the first wavelength to a tuned wavelength, also referred to as a secondary wavelength, in response to a tuning electrical input, also referred to as a secondary electrical input. The tuned wavelength is modifiable. With reference to FIG. 3, a pixel array 300 may comprise a plurality of pixels 200.

Figure 4:
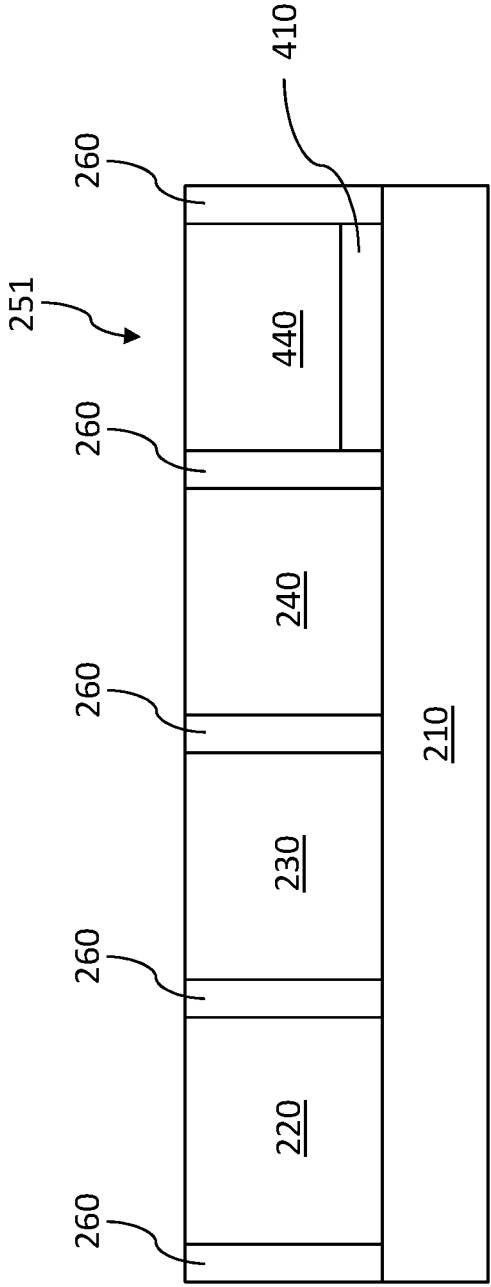
FIG. 4 shows a schematic cross-section of a pixel comprising non-tuneable sub-pixels and a tuneable sub-pixel that comprises a light-emitting material.
Figure 4:
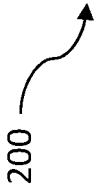

With reference to FIG. 4, a simplified cross-sectional view of the pixel 200 in accordance with a first embodiment of the disclosure is shown. The tuneable sub-pixel 251 may comprise a first light-emitting material 440, also referred to as a primary light-emitting material. The first light-emitting material 440 may comprise a quantum dot material that is configured to emit first light with a spectrum centred at a first wavelength in response to a first electrical input, via electrical pumping. The tuning element of the tuneable sub-pixel 251 is configured to modify the first wavelength to the tuned wavelength, and may comprise a piezo-electric actuator that may be actuated by a tuning electrical input. The piezo-electric actuator is configured to apply stress to the quantum dot material, which strains the quantum dot material. The tuned wavelength is a function of strain, such that the tuned wavelength can be modified by altering the stress applied to the quantum dot material. Thus, the tuned wavelength can be modified by changing the tuning electrical input, wherein the tuning electrical input may comprise a voltage. The function of strain may be dependent on the thickness of the quantum dot material and on the composition of the quantum dot material, in other words the stoichiometry of the quantum dot material. In an arrangement of the first embodiment, the tuned wavelength may be further optimized through continuously graded QDs and electrical injection (to counteract Auger decay).

Figure 5:
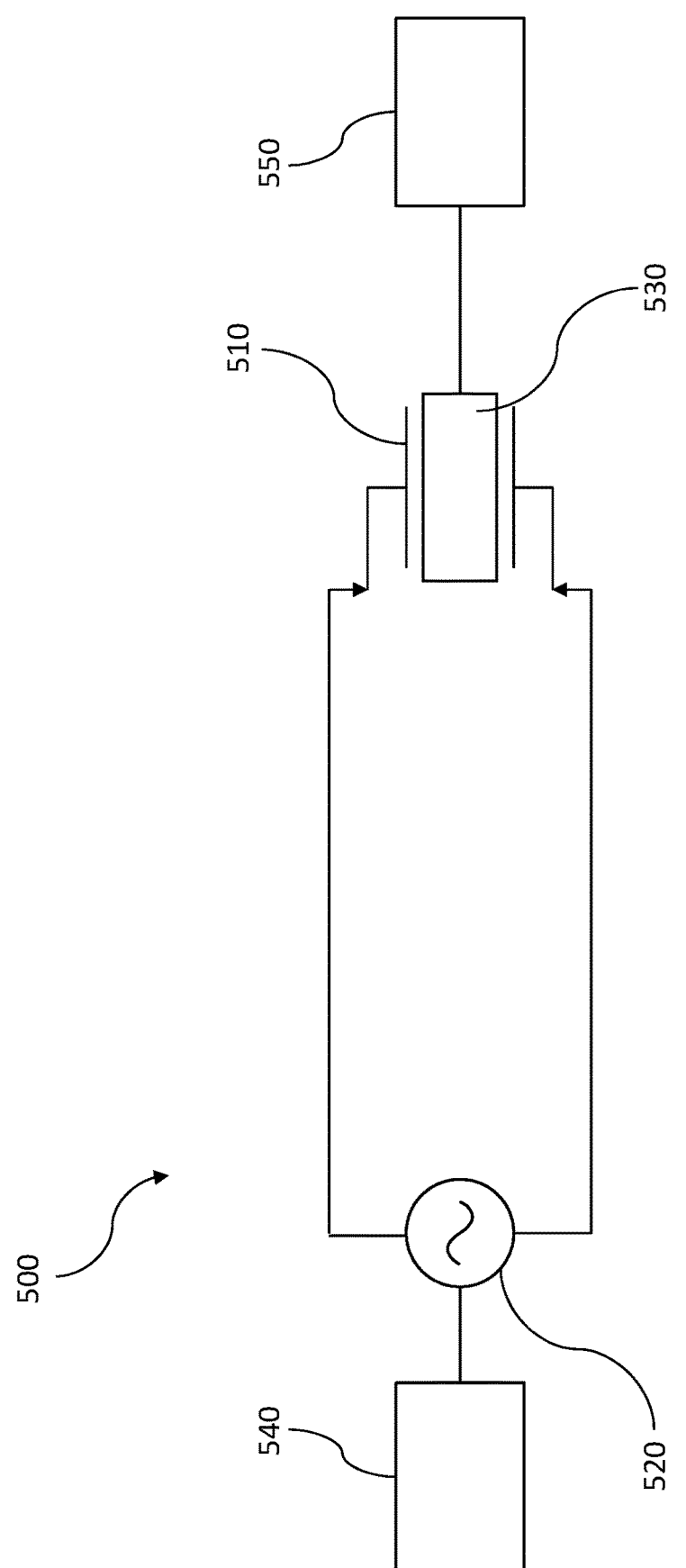
FIG. 5 shows a schematic of a circuit element comprising a piezoelectric actuator.

With reference to FIG. 5, the tuneable sub-pixel 251 in accordance with the first embodiment may further comprise a circuit element 500. The circuit element 500 may comprise a piezoelectric actuator 510 that may be actuated by a voltage supply 520. The piezoelectric actuator 510 applies stress to a quantum dot material 530, wherein a central wavelength of an emission spectrum of the quantum dot material 530 is a function of strain. The circuit element 500 may further comprise a connection to a timing control unit 540 that provides a signal to control a waveform of an electrical output provided by the voltage supply 520. The circuit element 500 may further comprise a connection that is part of a control feedback loop 550. The control feedback loop 550 modifies the signal from the voltage supply in the event that the tuned wavelength is not equal to the wavelength expected for the strain applied. Thus, the stress applied by the piezoelectric actuator 510 is modified such that the strain on the quantum dot material 530 is modified and the tuned wavelength is modified.

Figures 6, 6A, 6B:
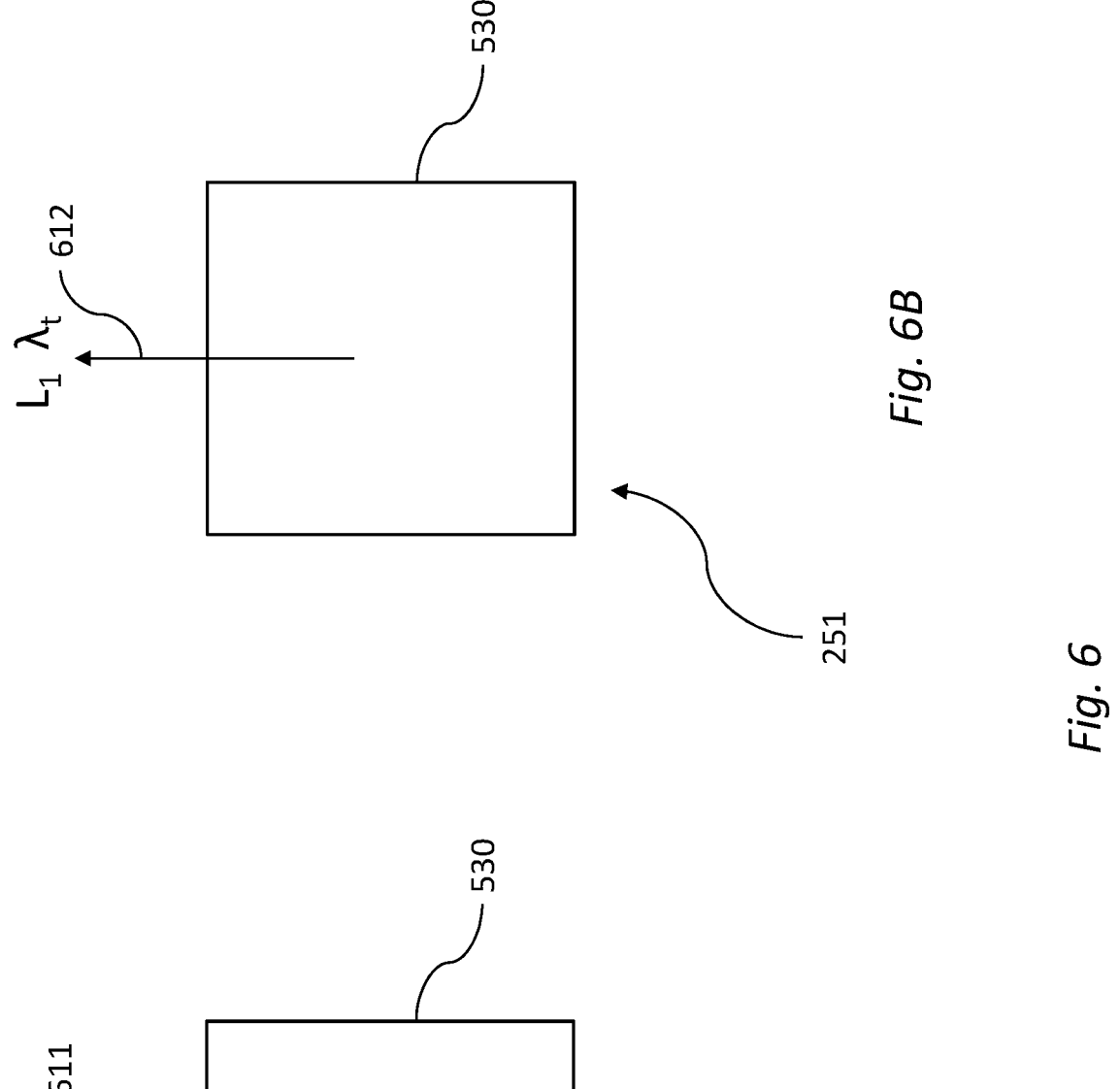
FIG. 6 shows a schematic indicating the light emitted by a quantum dot material without strain (FIG. 6A) and under strain (FIG. 6B).

With reference to FIG. 6A, quantum dot material 530 may be configured to emit first light $L_1$ at a first wavelength $\lambda_1$ 611 in response to application of a first electrical input. The quantum dot material 530 may undergo strain as a result of stress applied by a piezo-electric actuator that may be actuated by a tuning electrical input. Thus the first wavelength $\lambda_1$ is modified to a tuned wavelength $\lambda_t$, as shown in FIG. 6B, such that the quantum dot 530 may be configured to emit first light $L_1$ at a tuned wavelength $\lambda_t$ 612.

Figure 7:
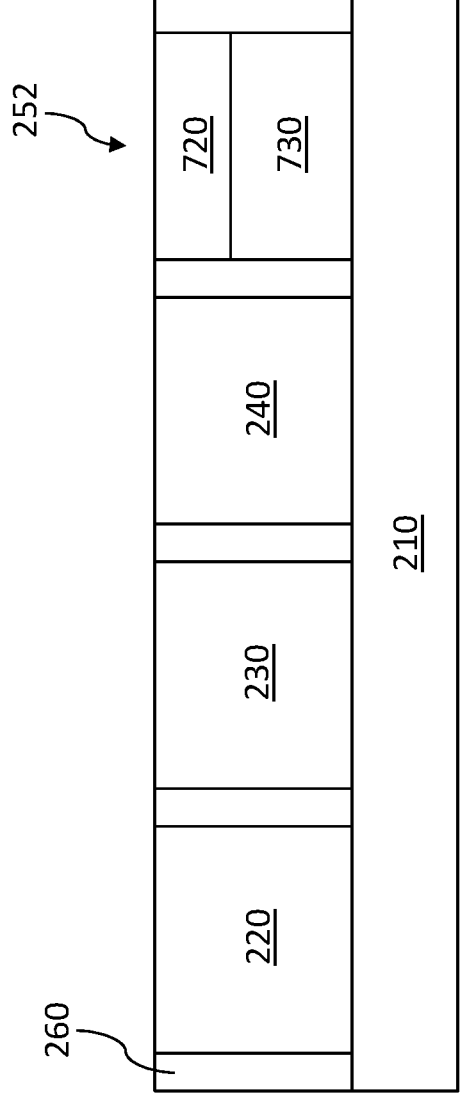
FIG. 7 shows a schematic cross-section of a pixel comprising non-tuneable sub-pixels and a tuneable sub-pixel that comprises a light-emitting material on a light emitter.

The quantum dot material 530 may be configured to emit light in response to an electrical input, via electrical pumping. It is also possible for quantum dots to emit light via electrically assisted optical pumping, wherein the quantum dots may emit first light $L_1$ at a first wavelength $\lambda_1$ in response to an electrical current and may also convert light that is incident on the quantum dots at an incident wavelength to light at the first wavelength $\lambda_1$. In a second embodiment, with reference to FIGS. 7 and 8, a tuneable sub-pixel 252 may comprise a quantum dot material 720 on a light-emitter 730, wherein the light-emitter 730 emits second light $L_2$ at a second wavelength $\lambda_2$ (also referred to as a light-emitter wavelength) 810 and wherein the light-emitter 730 may comprise a blue micro-LED. The quantum dot material 720 may be configured to emit first light $L_1$ at a first wavelength $\lambda_1$ 611 in response to a first electrical input. The quantum dot material 720 may be further configured to absorb the second light $L_2$ at the second wavelength $\lambda_2$ 810 and emit third light $L_3$ at the first wavelength $\lambda_1$ 821 in response, such that second light $L_2$ 810 emitted by the light-emitter 730 at the second wavelength $\lambda_2$ is converted to third light $L_3$ at the first wavelength $\lambda_1$ 821. The first and third light $L_1$ and $L_3$ at the first wavelength $\lambda_1$ 611 and 821 emitted by the quantum dot material 720 may be modified from the first wavelength $\lambda_1$ to first and third light $L_1$ and $L_3$ at the tuned wavelength $\lambda_t$ 612 and 822 via the tuning electrical input. The tuneable sub-pixel 252 may further comprise the circuit element 500 shown in FIG. 5, such that the tuning electrical input actuates a piezoelectric actuator. The piezoelectric actuator is configured to apply stress to the quantum dot material 720, which strains the quantum dot material 720. The tuned wavelength $\lambda_t$ is a function of strain, such that the tuned wavelength $\lambda_t$ can be modified by altering the stress applied to the quantum dot material 720. Thus, the tuned wavelength $\lambda_t$ can be modified by changing the tuning electrical input, wherein the tuning electrical input may comprise a voltage. The function of strain may be dependent on the thickness of the quantum dot material 720 and on the composition of the quantum dot material 720, in other words the stoichiometry of the quantum dot material 720.

Figure 9:
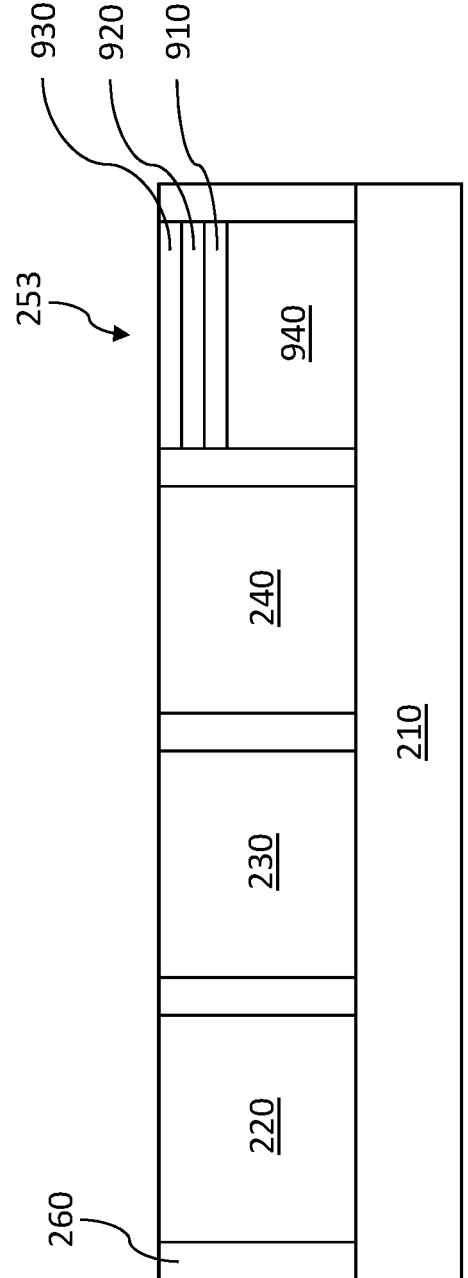
FIG. 9 shows a schematic cross-section of a pixel comprising non-tuneable sub-pixels and a tuneable sub-pixel that comprises a plurality of light-emitting materials on a light emitter.
Figure 10:
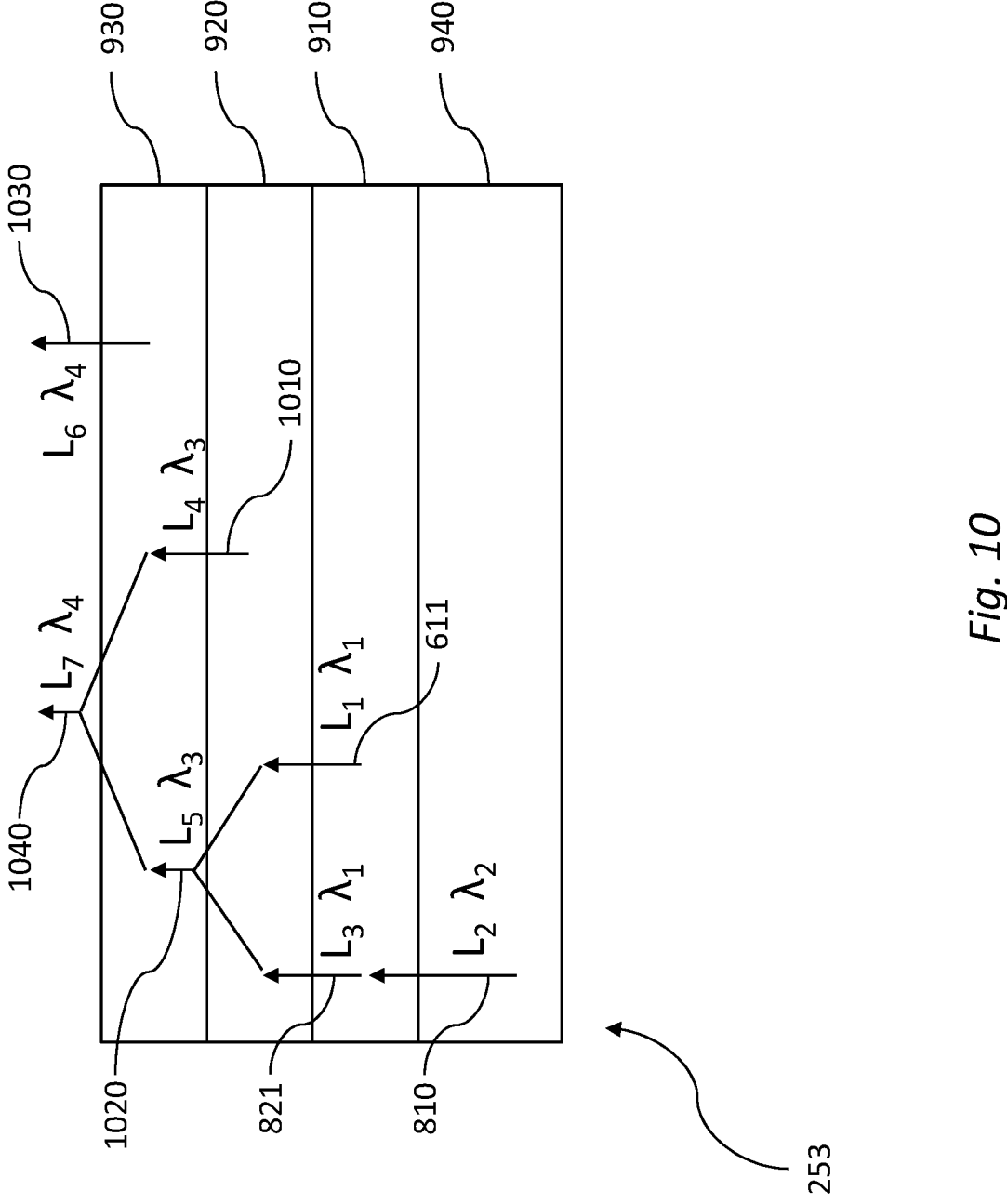
FIG. 10 shows a schematic indicating the light emitted from and converted by a plurality of light-emitting materials on a light-emitter.

In a third embodiment, a tuneable sub-pixel 253 may comprise a plurality of quantum dot materials that emit and convert light in different wavelength bands, and a light-emitter 940 that emits second light $L_2$ at a second wavelength $\lambda_2$ 810. With reference to FIGS. 9 and 10 the tuneable pixel 253 may comprise a first quantum dot material 910 that emits first light $L_1$ at a first wavelength $\lambda_1$ 611 in response to a first electrical input, wherein the first electrical input may comprise an electric current. The first quantum dot material 910 may further be configured to absorb the second light $L_2$ at the second wavelength $\lambda_2$ 810 and in response emit third light $L_3$ at the first wavelength $\lambda_1$ 821, such that the second light $L_2$ at the second wavelength $\lambda_2$ 810 is converted to third light $L_3$ at the first wavelength $\lambda_1$ 821. The tuneable pixel 253 may further comprise a second light-emitting material (also referred to as a secondary light-emitting material) comprising a second quantum dot material 920 that may be configured to emit fourth light $L_4$ at a third wavelength $\lambda_3$ (also referred to as a tertiary wavelength) 1010 in response to a second electrical input (also referred to as a tertiary electrical input). The second quantum dot material 920 may be further configured to absorb the first and third light $L_1$ and $L_3$ at the first wavelength $\lambda_1$ 611 and 821 and to emit fifth light $L_5$ at the third wavelength $\lambda_3$ 1020 in response, such that the first and third light $L_3$ at the first wavelength $\lambda_1$ 611 and 821 is converted to fifth light $L_5$ at the third wavelength $\lambda_3$ 1020. The tuneable pixel 253 may further comprise a third light-emitting material (also referred to as a tertiary light-emitting material) comprising a third quantum dot material 930 that may be configured to emit sixth light $L_6$ at a fourth wavelength $\lambda_4$ (also referred to as a quaternary wavelength) 1030 in response to a third electrical input (also referred to as a quaternary electrical input). The third quantum dot material 930 may be further configured to absorb the fourth and fifth light $L_4$ and $L_5$ at the third wavelength $\lambda_3$ 1010 and 1020 and to emit seventh light $L_7$ at the fourth wavelength $\lambda_4$ 1040 in response, such that the fourth and fifth light $L_4$ and $L_5$ at the third wavelength $\lambda_3$ 1010 and 1020 is converted to seventh light $L_7$ at the fourth wavelength $\lambda_4$ 1040.

The first, second and third quantum dot materials 910, 920 and 930 may emit or convert light only in the event that an electrical current is above a threshold. In the event that the electrical current is below the threshold, the quantum dot material may be transparent and may not emit or convert light. In the event that the electrical current is above the threshold, the quantum dot material may emit and convert light. In this way, the tuned wavelength $\lambda_t$ of the light emitted by the tuneable pixel may be modified by modifying a tuning electrical input, wherein the tuning electrical input comprises the first, second and third electrical inputs, in order to modify which of the first, second and third quantum dot materials 910, 920 and 930 emit light. In a certain arrangement of the third embodiment, the first quantum dot material may emit blue light and convert blue light to blue light with a specific blue wavelength range, the second quantum dot material may emit green light and convert blue light to green light, and the third quantum dot material may emit red light and convert green light to red light. In a certain arrangement of the third embodiment, when the first, second and third electrical inputs are all above the threshold the light emitted by the tuneable sub-pixel 253 may be white. In an arrangement of the third embodiment, the first, second and third quantum dot materials 910, 920 and 930 may be nanopatterned such that the quantum dot material is transparent in the event that it does not emit or convert light. In an arrangement of the third embodiment, the quantum dot material may be dissolved in a host matrix which is transparent and is deposited as a film that can be patterned. The host matrix may be an epoxy resin and the film may be patterned via nanoimprinting, photolithography, electron beam lithography or self-assembly.

The first, third and fourth wavelengths may be predetermined values, such that the tuned wavelength of the light emitted by the tuneable sub-pixel 255 is modified only by modifying the combination of the first, second and third light-emitting materials 910, 920 and 930 that emits light. In another arrangement, the first, third and fourth wavelengths may be modified, such that the tuned wavelength of the light emitted by the tuneable sub-pixel 253 is modified by modifying the combination of the first, second and third light-emitting materials 910, 920 and 930 that emits light and by modifying the wavelengths at which the first, second and third light-emitting materials 910, 920 and 930 emit light.

Figure 11:
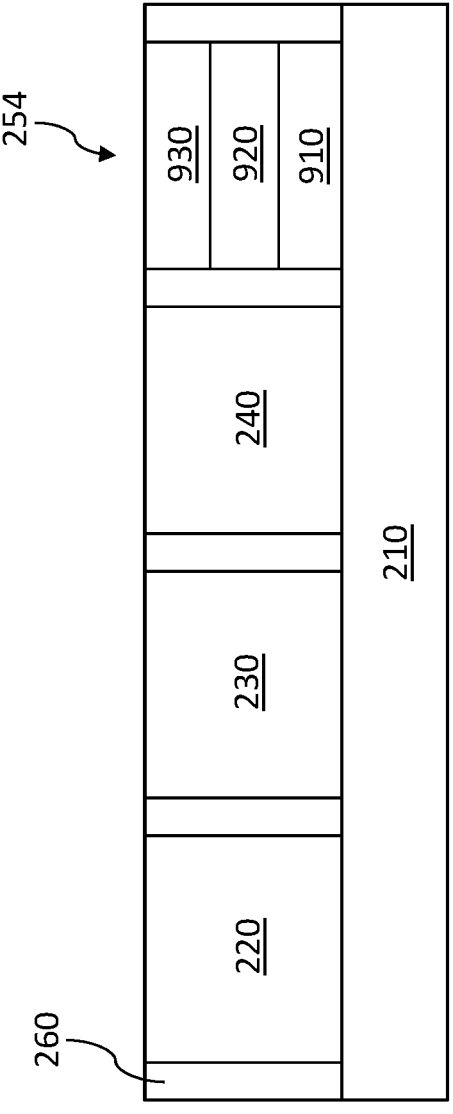
FIG. 11 shows a schematic cross-section of a pixel comprising non-tuneable sub-pixels and a tuneable sub-pixel that comprises a plurality of light-emitting materials.
Figure 12:
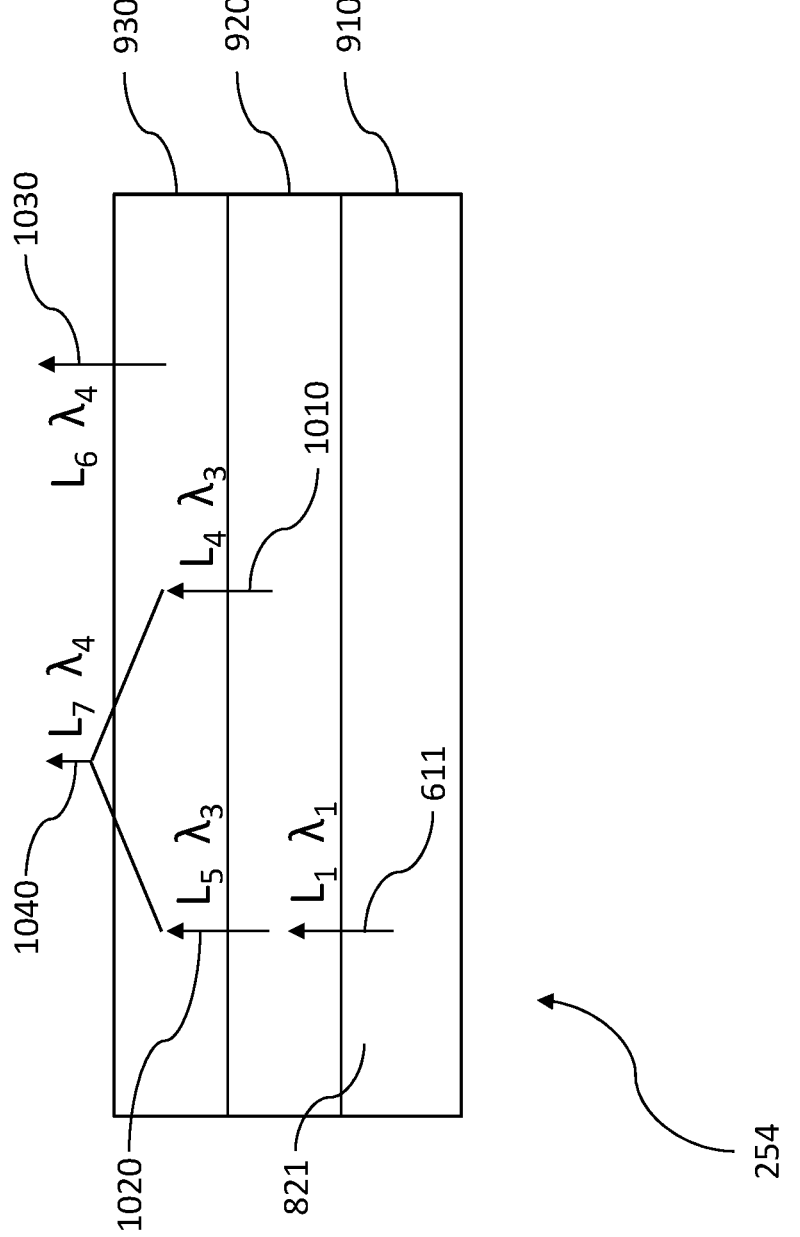
FIG. 12 shows a schematic indicating the light emitted from and converted by a plurality of light-emitting materials.

With reference to FIGS. 11 and 12, a fourth embodiment is shown. A tuneable sub-pixel 254 of the fourth embodiment may be similar to that of the third embodiment but may not comprise the light-emitter 940. Thus, the first quantum dot material may undergo electrical pumping only. The tuneable pixel 254 may comprise a first quantum dot material 910 that emits first light $L_1$ at a first wavelength $\lambda_1$ 611 in response to a first electrical input, wherein the first electrical input may comprise an electric current. The tuneable pixel 254 may further comprise a second quantum dot material 920 that may be configured to emit fourth light $L_4$ at a third wavelength $\lambda_3$ 1010 in response to a second electrical input. The second quantum dot material 920 may be further configured to absorb the first light $L_1$ at the first wavelength $\lambda_1$ 611 and to emit fifth light $L_5$ at the third wavelength $\lambda_3$ 1020 in response, such that the first light $L_1$ at the first wavelength $\lambda_1$ 611 is converted to fifth light $L_5$ at the third wavelength $\lambda_3$ 1020. The tuneable pixel 254 may further comprise a third quantum dot material 930 that may be configured to emit sixth light $L_6$ at a fourth wavelength $\lambda_4$ 1030 in response to a third electrical input. The third quantum dot material 930 may be further configured to absorb the fourth and fifth light $L_4$ and $L_5$ at the third wavelength $\lambda_3$ 1010 and 1020 and to emit seventh light $L_7$ at the fourth wavelength $\lambda_4$ 1040 in response, such that the fourth and fifth light $L_4$ and $L_5$ at the third wavelength $\lambda_3$ 1010 and 1020 is converted to seventh light $L_7$ at the fourth wavelength $\lambda_4$ 1040. Similarly to the third embodiment, the first, second and third quantum dot materials 910, 920 and 930 may emit and convert light only in the event that the first, second and third electrical inputs are above a threshold and so the tuned wavelength $\lambda_t$ of the light emitted by the tuneable sub-pixel 254 may be modified by modifying a tuning electrical input wherein the tuning electrical input comprises the first, second and third electrical inputs. In an arrangement of the fourth embodiment, the first, second and third quantum dot materials 910, 920 and 930 may be nanopatterned such that the quantum dot material is transparent in the event that it does not emit or convert light. The quantum dot material may be dissolved in a host matrix which is transparent and is deposited as a film that can be patterned. The host matrix may be an epoxy resin and the film may be patterned via nanoimprinting, photolithography, electron beam lithography or self-assembly.

Figure 13:
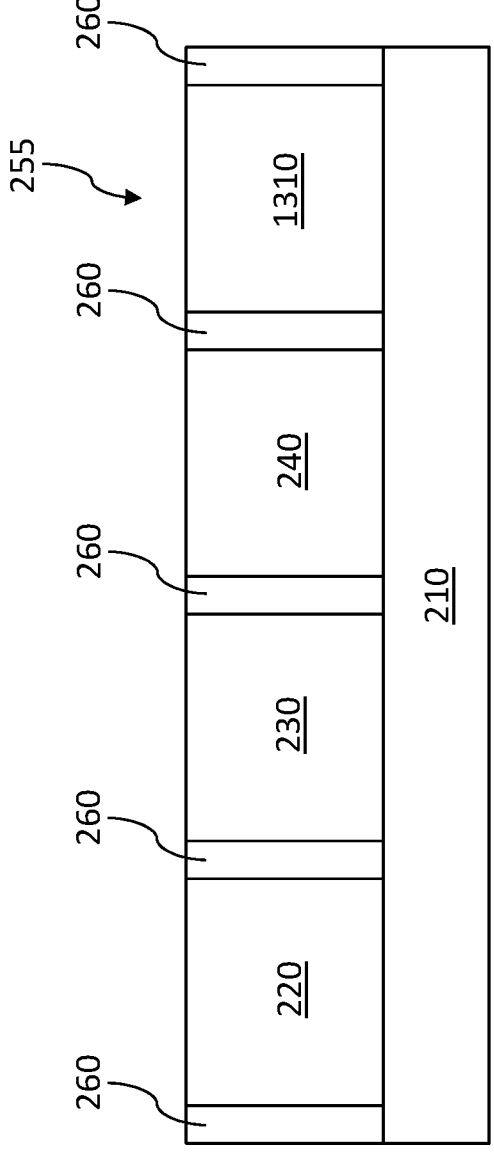
FIG. 13 shows a schematic cross-section of a pixel comprising non-tuneable sub-pixels and a tuneable sub-pixel that comprises a light-emitting material.
Figure 13:
Figures 14, 14A, 14B:
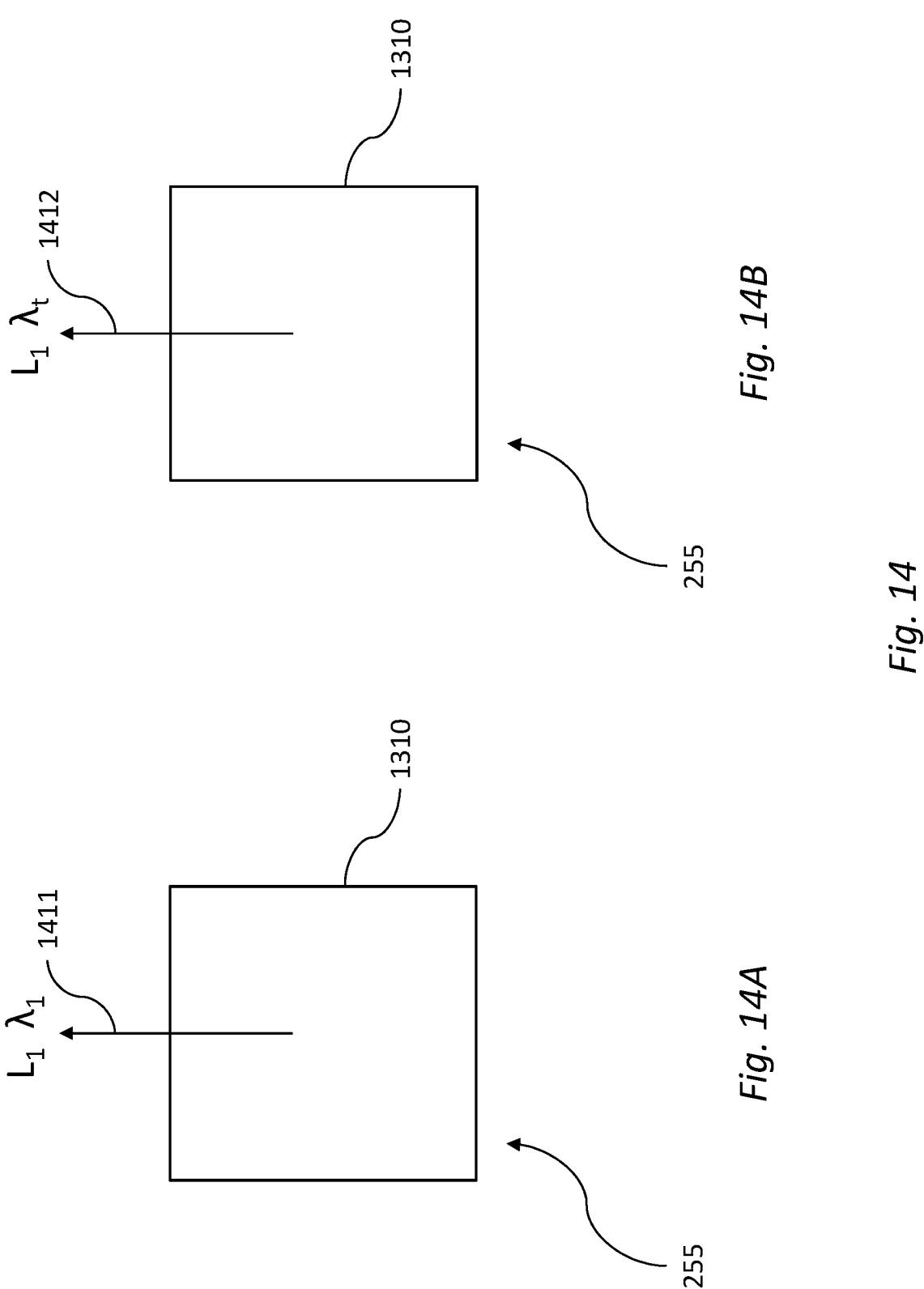
FIG. 14 shows a schematic indicating the light emitted by a light-emitting material without a change in molecular topology (FIG. 14A) and with a change in molecular topology (FIG. 14B).

In a fifth embodiment, with reference to FIGS. 13 and 14, a first light-emitting material 1310 may comprise light-emitting molecules that emit first light $L_1$ at a first wavelength $\lambda_1$ 1411 in response to a first electrical input (FIG. 14A), wherein the first wavelength $\lambda_1$ may be modified to a tuned wavelength $\lambda_t$ by modifying a molecular topology of the light-emitting molecules such that the light-emitting molecules undergo folding or frustration. The molecular topology may be modified via a tuning electrical input, wherein the tuning electrical input may comprise an electric field and the tuned wavelength $\lambda_t$ may be a function of the tuning electrical input. Thus, the wavelength of the light emitted by the tuneable sub-pixel 255 may be modified by modifying the tuning electrical input such that the light-emitting material 1310 emits first light $L_1$ at the tuned wavelength $\lambda_1$ 1412 (FIG. 14B). In a certain arrangement of the fifth embodiment, the tuneable sub-pixel 255 may only emit light in the event that the light-emitting molecules have a molecular topology within a certain range of light-emitting molecular topologies. In the event that the tuning electrical input results in a molecular topology that is not a light-emitting molecular topology, the light-emitting molecules do not emit light. In this way, the tuned wavelength $\lambda_t$ of the light emitted by the tuneable sub-pixel 255 may be modified by modifying the tuning electrical input, and the tuneable sub-pixel may stop emitting light at a certain value of the tuning electrical input.

Figure 15:
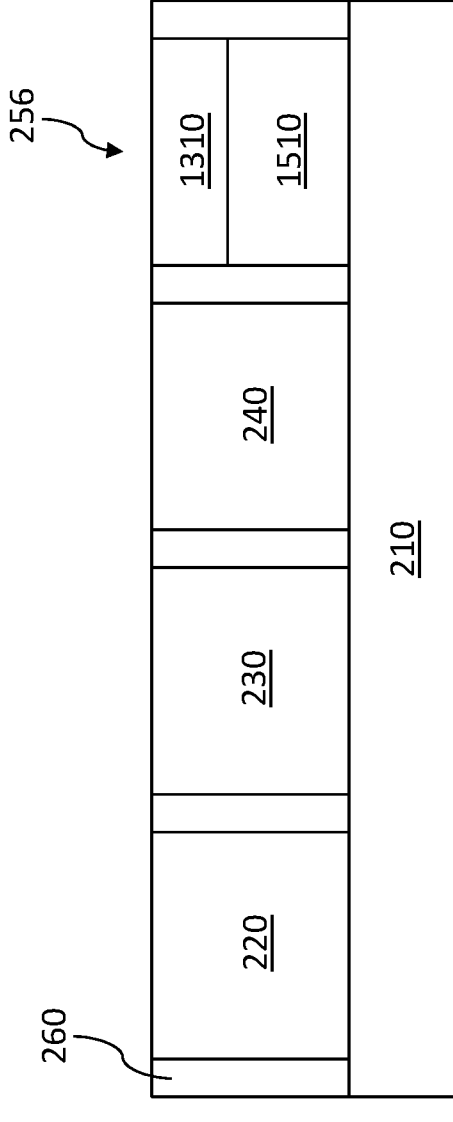
FIG. 15 shows a schematic cross-section of a pixel comprising non-tuneable sub-pixels and a tuneable sub-pixel that comprises a light-emitting material on a light-emitter.
Figure 15:

With reference to FIGS. 15 and 16, in a first variation on the fifth embodiment the tuneable sub-pixel 256 may further comprise a light-emitter 1510 that emits second light $L_2$ at a second wavelength $\lambda_2$ (also referred to as a light-emitter wavelength) 1610. The first light-emitting material 1310 comprising light-emitting molecules may be further configured to absorb the second light $L_2$ at the second wavelength $\lambda_2$ 1610 and in response emit third light $L_3$ at the first wavelength $\lambda_1$ 1621. This is shown in FIG. 16A. The first wavelength $\lambda_1$ may be modified to a tuned wavelength $\lambda_t$ by modifying the molecular topology of the light-emitting molecules 910 via a tuning electrical input, such that the first light-emitting material 1310 emits first and third light $L_1$ and $L_3$ at the tuned wavelength $\lambda_t$ 1412 and 1622 (FIG. 16B).

Figure 17:
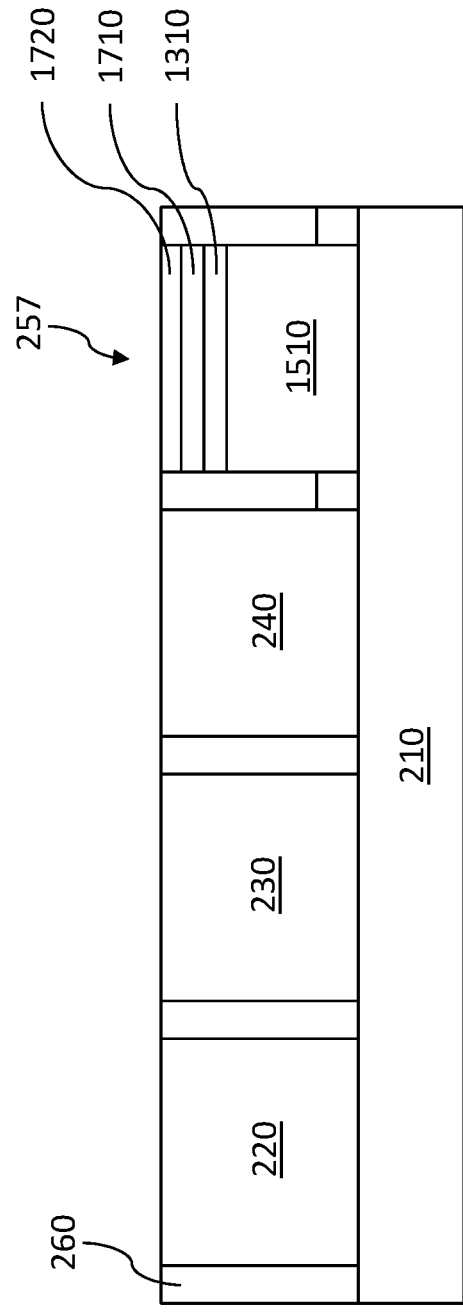
FIG. 17 shows a schematic cross-section of a pixel comprising non-tuneable sub-pixels and a tuneable sub-pixel that comprises a plurality of light-emitting materials on a light emitter.
Figure 18:
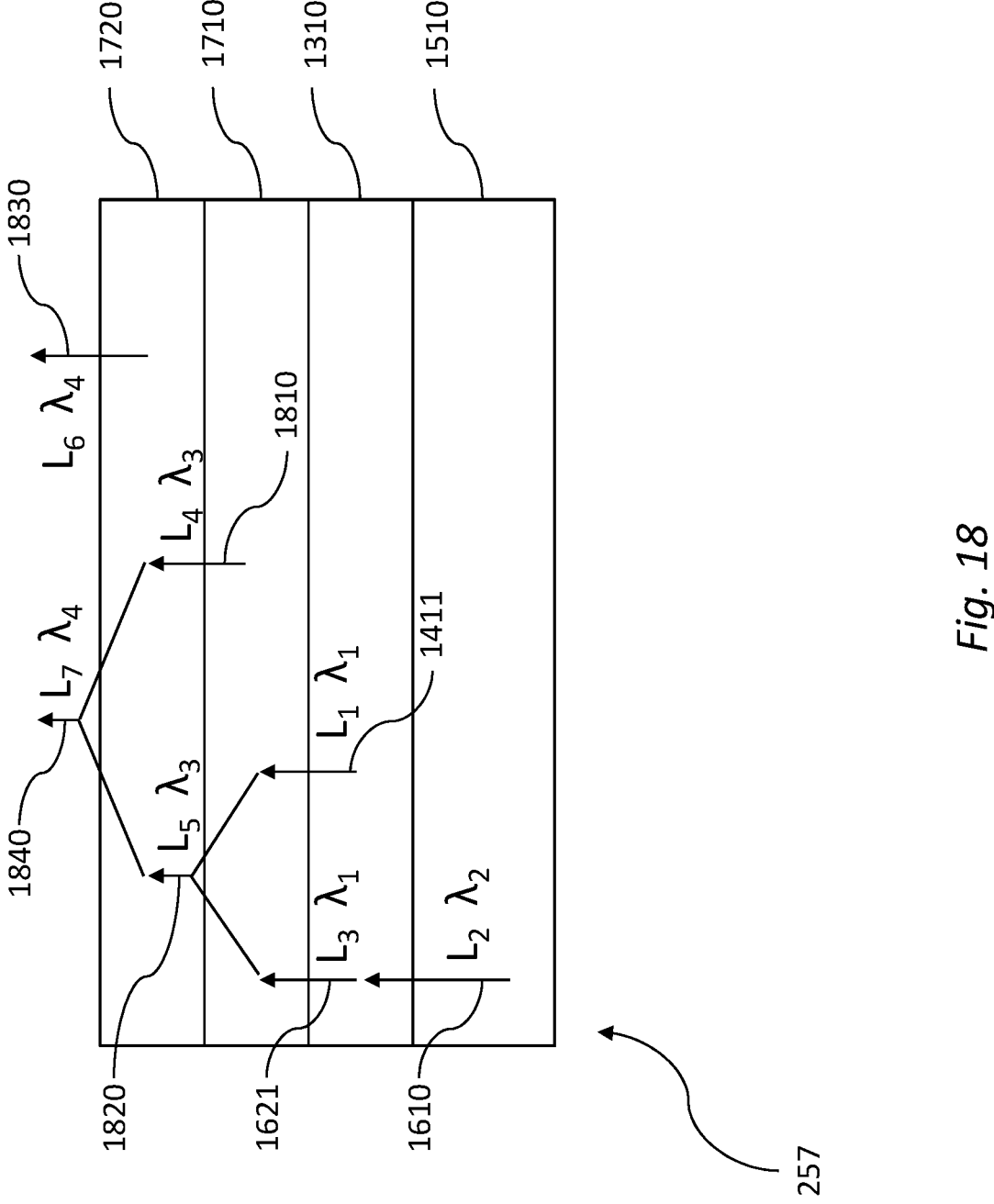
FIG. 18 shows a schematic indicating the light emitted from and converted by a plurality of light-emitting materials on a light-emitter.

With reference to FIGS. 17 and 18, in a second variation on the fifth embodiment the tuneable sub-pixel 257 may further comprise a light-emitter 1510, a second light-emitting material 1710, also referred to as a secondary light-emitting material, and a third light-emitting material 1720, also referred to as a tertiary light-emitting material. The light-emitter 1510 may emit second light $L_2$ at a second wavelength $\lambda_2$ 1610 such that the first light-emitting material 1310 comprising light-emitting molecules may be further configured to absorb the second light $L_2$ at the second wavelength $\lambda_2$ 1610 and in response emit third light $L_3$ at the first wavelength $\lambda_1$ 1621. The second light-emitting material 1710 may comprise light-emitting molecules that are configured to emit fourth light $L_4$ at a third wavelength $\lambda_3$ (also referred to as a tertiary wavelength) 1810 in response to a second electrical input (also referred to as a tertiary electrical input). The second light emitting material 1710 may be further configured to absorb light at the first wavelength $\lambda_1$ and emit fifth light $L_5$ at a third wavelength $\lambda_3$ 1820. The second light-emitting material 1710 may therefore emit fourth light $L_4$ at the third wavelength $\lambda_3$ 1810 and convert first and third light $L_1$ and $L_3$ at the first wavelength $\lambda_1$ 1411 and 1621 to fifth light $L_5$ at a third wavelength $\lambda_3$ 1820. The third light-emitting material 1720 may comprise light-emitting molecules that are configured to emit sixth light $L_6$ at a fourth wavelength $\lambda_4$ (also referred to as a quaternary wavelength) 1830 in response to a third electrical input (also referred to as a quaternary electrical input). The third light-emitting material may be further configured to absorb light at the third wavelength $\lambda_3$ and emit seventh light $L_7$ at a fourth wavelength $\lambda_4$ 1840. The third light-emitting material 1720 may therefore emit sixth light $L_6$ at the fourth wavelength $\lambda_4$ 1830 and convert fourth and fifth light $L_4$ and $L_5$ at the third wavelength $\lambda_3$ 1810 and 1820 to seventh light $L_7$ at the fourth wavelength $\lambda_4$ 1840. The first, second and third light-emitting materials 1310, 1710 and 1720 may emit light and convert light only in the event that the first, second and third electrical inputs are within a predetermined range. The first, second and third light-emitting materials 1310, 1710 and 1720 may be transparent to visible light when the first, second and third electrical inputs are not within the predetermined range and the first, second and third light-emitting materials 1310, 1710 and 1720 are not emitting or converting light. The tuned wavelength of the light emitted by the tuneable pixel 257 may therefore be modified by modifying the first, second and third electrical inputs. The first, third and fourth wavelengths may be pre-determined values, such that the tuned wavelength of the light emitted by the tuneable sub-pixel 257 is modified only by modifying the combination of the first, second and third light-emitting materials 1310, 1710 and 1720 that emits light. In another arrangement, the first, third and fourth wavelengths may be modified by modifying the first, second and third electrical inputs within the predetermined range, such that the tuned wavelength of the light emitted by the tuneable sub-pixel 257 is modified by modifying the combination of the first, second and third light-emitting materials 1310, 1710 and 1720 that emits light and by modifying the wavelengths at which the first, second and third light-emitting materials 1310, 1710 and 1720 emit light.

In a third variation on the fifth embodiment (not illustrated in the drawings) the tuneable sub-pixel may further comprise second and third light-emitting materials 1710 and 1720 comprising light-emitting molecules. The second light-emitting material 1710 may be configured to emit fourth light $L_4$ at the third wavelength $\lambda_3$ and to convert the first light $L_1$ at the first wavelength $\lambda_1$ to fifth light $L_5$ at the third wavelength $\lambda_3$. The third light-emitting material 1720 may be configured to emit sixth light $L_6$ at the fourth wavelength $\lambda_4$ and to convert fourth and fifth light $L_4$ and $L_5$ at the third wavelength $\lambda_3$ to seventh light $L_7$ at the fourth wavelength $\lambda_4$. The first, third and fourth wavelengths may be pre-determined values, such that the tuned wavelength of the light emitted by the tuneable sub-pixel is modified only by modifying the combination of the first, second and third light-emitting materials 1310, 1710 and 1720 that emits light. In another arrangement, the first, third and fourth wavelengths may be modified by modifying the first, second and third electrical inputs within the predetermined range, such that the tuned wavelength of the light emitted by the tuneable sub-pixel is modified by modifying the combination of the first, second and third light-emitting materials 1310, 1710 and 1720 that emits light and by modifying the wavelengths at which the first, second and third light-emitting materials 1310, 1710 and 1720 emit light.

In a certain arrangement of the fifth embodiment, one or more of the first, second and third light-emitting materials 1310, 1710 and 1720 may be dissolved in a host matrix which is transparent and is deposited as a film that can be patterned such that it is transparent when not emitting light. The host matrix may be an epoxy resin and the film may be patterned via nanoimprinting, photolithography, electron beam lithography or self-assembly.

The non-tuneable sub-pixels may emit light in response to an electric current. The electric current may be applied to a non-tuneable sub-pixel via an electrode pair, wherein the electrode pair may apply an electric current to only one sub-pixel or wherein one or more of the electrodes may be common to one or more sub-pixels. The tuneable sub-pixel 250 may emit light in response to an electrical input, wherein the electrical input may be applied via one or more electrodes. In the first embodiment, the light-emitting material 440 may emit light in response to a first electrical input wherein the first electrical input may be applied via an electrode 410. The electrode 410 may be driven by a digital backplane, wherein the substrate 210 may comprise the digital backplane. In the second embodiment the light-emitter 730 may emit light in response to an electric current, wherein the electric current may be applied via an electrode (not shown). The quantum dot material 720 may emit light in response to a first electrical input that may be applied via an electrode. In the third embodiment the light-emitter 940 may emit light in response to an electric current, wherein the electric current may be applied via an electrode (not shown). In the third and fourth embodiments, the first, second and third quantum dot materials 910, 920 and 930 may emit light in response to first, second and third electrical inputs which may be applied via one or more electrodes. The first, second, third and fourth embodiments may further comprise an electrode layer that comprises electrodes which apply electrical inputs to the quantum dot materials. In the fifth embodiment, the tuning electrical input comprising an electric field may be applied using one or more electrodes. In the first variation of the fifth embodiment, the light-emitter may emit light in response to an electric current applied via an electrode. In the second and third variations on the fifth embodiment, the first, second and third light-emitting materials may emit light in response to first, second and third electrical inputs applied via electrodes. In any embodiment, the tuning electrical input may be applied via a tuning electrode, wherein the tuning electrode may be common with another electrode or wherein the tuning electrode may be separate to the other electrodes.

In use, the tuneable sub-pixel may be used to modify the luminance, resolution or colour of the pixel 200. One way in which luminance of the pixel 200 may be increased would be by having the tuneable sub-pixel 250 emit white light. One method of increasing the resolution of the pixel 200 may be to have the tuneable sub-pixel 250 emit green light. The colour gamut of the pixel 200 may also be modified by modifying the tuned wavelength $\lambda_t$ of the light emitted by the tuneable sub-pixel 250, and the tuneable sub-pixel 250 may be configured to emit light at a wavelength that is outside the colour gamut of the non-tuneable sub-pixels. Local defects may also be compensated for. For example, in the event that there is a yellow shift when the pixel 200 is intended to be white, one way to compensate for the shift would be to have the tuneable sub-pixel 250 configured to emit blue light. In the event that a sub-pixel degrades over time, for example changing colour or losing luminance, one method of compensating for the degradation would be to use the tuneable sub-pixel 250 such that the pixel 200 emits light of the intended colour and luminance. In the event of a dead sub-pixel the tuneable sub-pixel 250 may be configured to simply replace the dead sub-pixel. Thus, the tuneable sub-pixel may provide flexibility at sub-pixel level and may increase operating lifetime of a display comprising pixels 200.

The tuneable sub-pixel 250 may further comprise a controller, wherein the controller is configured to drive the electrodes that apply the tuning electrical input such that the tuned wavelength $\lambda_t$ may be modified. The controller may be further configured to modify the tuning electrical input based on an input, wherein the input may obtained from a user instruction or from a measurement of the light emitted by the pixel 200. For example, the user instruction may comprise a mode of use, wherein the user may select a mode that may comprise higher luminance or higher resolution. In another example, the measurement of the light emitted by the pixel 200 may be used to modify the tuning electrical input such that the tuned wavelength $\lambda_t$ compensates for colour degradation of a non-tuneable sub-pixel or other local defects.

Where light is described as having a particular wavelength, the light may be only at that particular wavelength, or the light may have a spectrum with a finite full-width half-maximum that may be centred at that particular wavelength. In the event that the light has a spectrum that may be centred at that particular wavelength, the spectrum may be narrow or broad.

13

14

The invention claimed is:

1. A light-emitting device having a pixel comprising:
a first non-tuneable sub-pixel configured to emit light at a first non-tuneable wavelength; and
a tuneable sub-pixel configured to emit light at a tuneable wavelength, wherein the tuneable sub-pixel comprises:
    a primary light-emitting material configured to emit light at a primary wavelength in response to a primary electrical input; and
    a tuning element configured to modify the primary wavelength to a secondary wavelength, wherein the secondary wavelength is tuneable, in response to a secondary electrical input; and
    wherein the primary light emitting material comprises a light emitting molecule configured to emit light at wavelengths tuneable between the primary wavelength and the secondary wavelength by applying an electric field via the secondary electrical input so as to influence molecular topology of the light emitting molecule.

2. The light-emitting device of claim 1 further comprising a secondary light-emitting material comprising a light-emitting molecule configured to convert light at the primary wavelength to light at a tertiary wavelength and to emit light at the tertiary wavelength in response to a tertiary electrical input.

3. The light-emitting device of claim 2 further comprising a tertiary light-emitting material comprising a light-emitting molecule configured to convert light at the tertiary wavelength to light at a quaternary wavelength and to emit light at the quaternary wavelength in response to a quaternary electrical input.

4. The light-emitting device of claim 3 wherein the primary, secondary and tertiary light-emitting materials emit light in an event that an applied electric current is within a range and transmit light in an event that an applied electric current is outside the range.

5. The light-emitting device of claim 1 wherein the tuneable sub-pixel further comprises a light emitter that emits light at a light emitter wavelength and wherein the primary light-emitting material is further configured to modify the light emitted at the light emitter wavelength such that the light emitted by the primary light-emitting material is at the primary wavelength.

6. The light-emitting device of claim 1 wherein:
the primary light-emitting material is dissolved in a host material; and/or
the primary light-emitting material is nanopatterned.

7. The light-emitting device of claim 1, further comprising a controller configured to modify the secondary electrical input.

8. The light-emitting device of claim 2 wherein:
the secondary light-emitting material is dissolved in a host material; and/or
the secondary light-emitting material is nanopatterned.

9. The light-emitting device of claim 3 wherein:
the tertiary light-emitting material is dissolved in a host material; and/or
the tertiary light-emitting material is nanopatterned.

10. The light-emitting device of claim 1 wherein the pixel has a second non-tuneable sub-pixel configured to emit light at a second non-tuneable wavelength and a third non-tuneable sub-pixel configured to emit light at a third non-tuneable wavelength.

11. The light-emitting device of claim 10 wherein the first, second and third non-tuneable sub-pixels each emit one of red, green and blue light.

12. The light-emitting device of claim 7, wherein the controller is further configured to modify the secondary electrical input in response to an input.

\* \* \* \* \*